(12) United States Patent
Cha (10) Patent No.: US 6,503,795 B2
(45) Date of Patent: Jan. 7, 2003

(54) METHOD FOR FABRICATING A SEMICONDUCTOR DEVICE HAVING A STORAGE CELL

(75) Inventor: Seon Yong Cha, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/101,332

(22) Filed: Mar. 20, 2002

(65) Prior Publication Data

US 2002/0142555 A1 Oct. 3, 2002

(30) Foreign Application Priority Data

Mar. 28, 2001 (KR) .......................................... 2001-16304

(51) Int. Cl.⁷ .......................................... H01L 21/8242
(52) U.S. Cl. ....................................... 438/253; 438/396
(58) Field of Search ................................. 438/238–240, 438/3, 250–256, 381, 393–399

(56) References Cited

U.S. PATENT DOCUMENTS 6,060,351 A * 5/2000 Parekh et al. ................ 438/253
6,396,092 B1 * 5/2002 Takatani et al. ............. 257/295

* cited by examiner

*Primary Examiner*—Jey Tsai
(74) *Attorney, Agent, or Firm*—Finnegan, Henderson, Farabow, Garrett & Dunner, L.L.P.

(57) ABSTRACT

The present invention discloses a method for fabricating a semiconductor device. In an open bit line cell aligned local interconnection type device having a minimum line width of 1F and a pattern interval of 1F, hard masks are formed on respective conductive layers, and insulating spacers are formed at the side walls thereof, thereby preventing the adjacent conductive layers from being shorted out and maintaining the minimum pattern interval. As a result, a high, integration of the device is achieved, and the process yield and reliability of the device are improved.

2 Claims, 11 Drawing Sheets

METHOD FOR FABRICATING A SEMICONDUCTOR DEVICE HAVING A STORAGE CELL

BACKGROUND OF THE INVENTION

1. Field of the Invention

The present invention relates to a method for fabricating a semiconductor device, and in particular to an improved method for fabricating a semiconductor device which can, for example, miniaturize the device, and improve a process yield and reliability of the device.

2. Description of the Background Art

Recently, high integration of semiconductor devices have been remarkably influenced by development of minute pattern formation technologies. It is thus required to miniaturize a photoresist film pattern used as a mask for etching or ion implant process in the fabrication process of the semiconductor device.

A resolution (R) of the photoresist film pattern is closely related with the quality of the photoresist film itself and adhesion with a substrate. Most of all, the resolution (R) is proportional to a light source wavelength ($\lambda$) and a process variable (k) of a miniature exposer, and inversely proportional to a numerical aperture (NA) of the exposer according to the following relationship:

[R=k*$\lambda$/NA, where R=resolution, $\lambda$=light source wavelength, NA=numerical aperture]

Typically, the wavelength of the light source is reduced to improve optical resolution of the miniature exposer. For example, G-line and i-line miniature exposers having a wavelength of 436 nm and 365 nm, respectively, show a process resolution of about 0.7 $\mu$m and 0.5 $\mu$m in a line/space pattern. An exposer using a deep ultraviolet (DUV) light source having a shorter wavelength, such as a KrF laser having a wavelength of 248 nm, or an ArF laser having a wavelength of 193 nm, must be used to form a minute pattern below 0.5 $\mu$m.

In addition, in order to improve resolution, known methods use a phase shift mask as an exposure mask, a contrast enhancement layer (CEL) method to form a thin film on a wafer to improve an image contrast, a tri-layer resister (TLR) which includes an intermediate layer, such as a spin on glass (SOG) between two photoresist films, and a silylation method to selectively implant silicon to an upper portion of a photoresist film.

Another known method reduces cell area by changing cell alignment design to achieve high integration.

Figure 1:
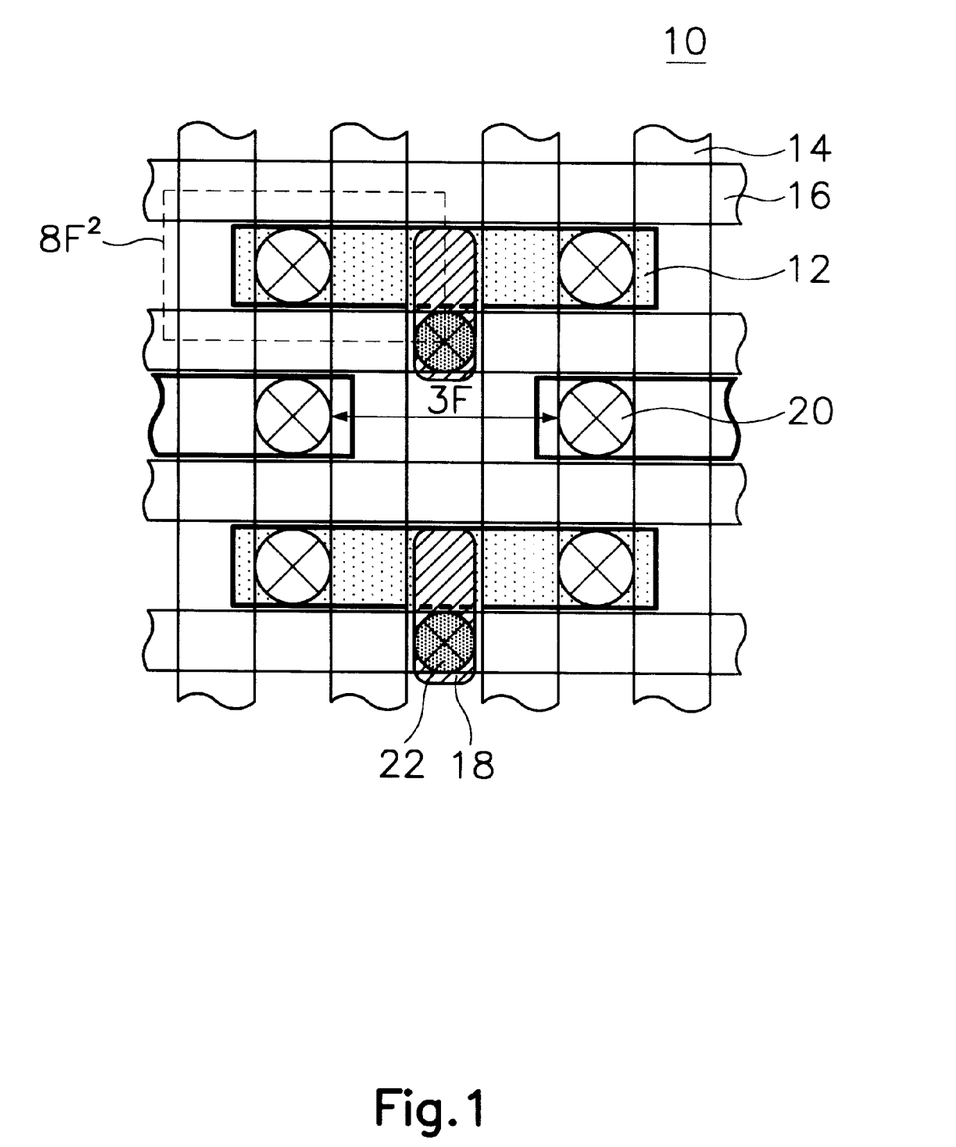
FIG. 1 is a layout diagram illustrating a first example of a conventional semiconductor device.

FIG. 1 is a layout diagram illustrating a first example of a conventional semiconductor device, especially of 8F² folded bit line cell alignment (as described more fully hereinbelow).

Firstly, rectangular active regions 12 are aligned in a matrix shape on a semiconductor substrate 10 such as a silicon wafer. Two evenly spaced word lines 14 cross each active region 12 in a horizontal direction, and bit lines 16 in a vertical direction are positioned in spaces between the active regions 12. The bit lines 16 are connected to the center portions of the active regions 12 through local interconnections 18. Two charge storage electrode contact holes 20 are formed at both sides of the active region 12, and the local interconnection 18 and the bit line 16 are connected through a bit line contact hole 22 at the center portion of the active region 12.

If a minimum line width of the device is F, the active regions 12 are alternately aligned to have an interval of 3F in a word line direction and 1F in a bit line direction. Accordingly, an area of a unit cell is 8F².

Such a cell alignment structure has an excellent noise restricting property, but has limitation in reducing the cell area.

Figure 2:
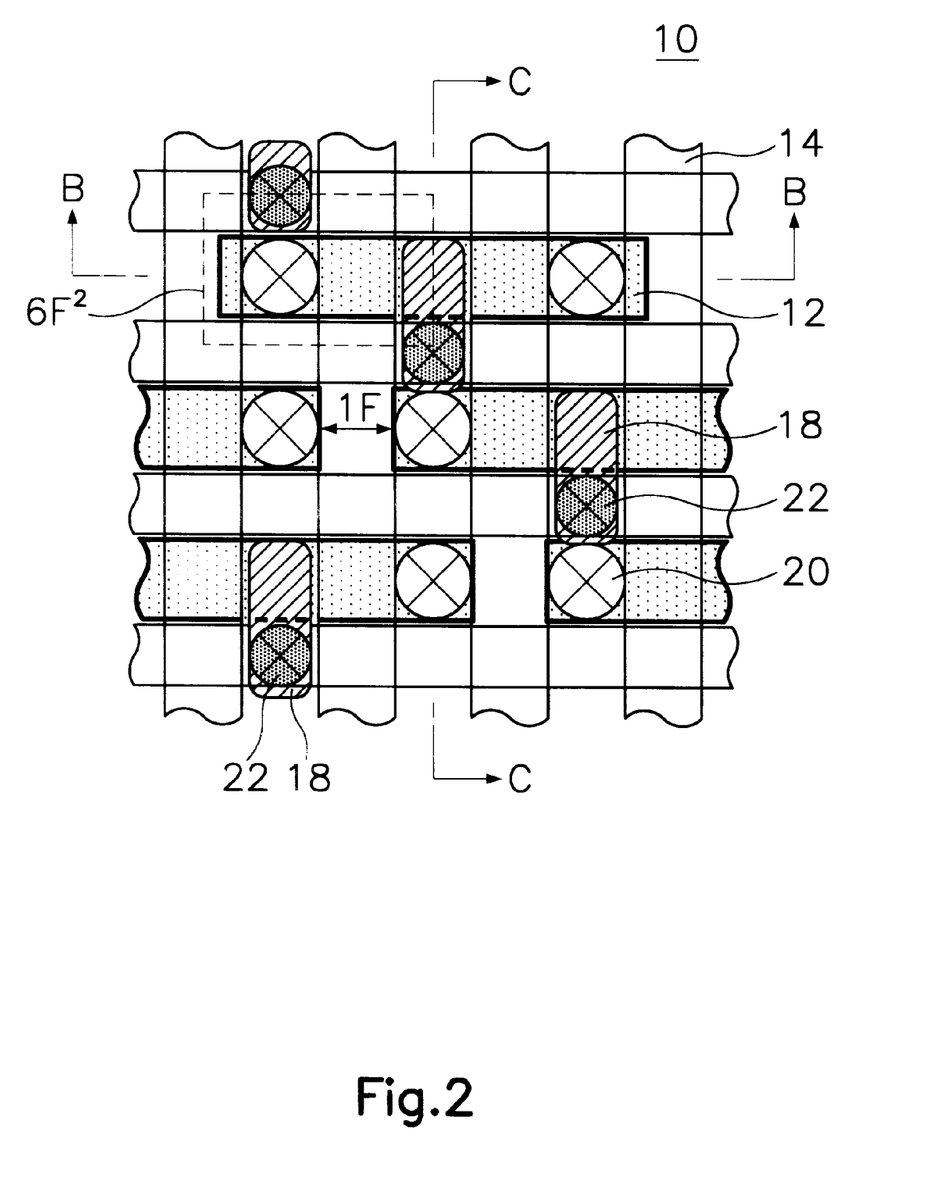
FIG. 2 is a layout diagram illustrating a second example of a conventional semiconductor device.

FIG. 2 is a layout diagram illustrating a second example of a conventional semiconductor device, especially of 6F² open bit line cell alignment. This structure is similar to the structure of FIG. 1, but the interval of the active regions 12 is 1F in both directions at a minimum line width of F. Therefore, the adjacent upper and lower active regions 12 can be moved in a horizontal direction by 2F.

In the open bit line cell, information is shown simultaneously in the two adjacent bit lines for each selection of a word line. Since a sensing circuit cannot distinguish the two adjacent bit lines, the sensing circuit senses and compares bit lines of different blocks.

This cell alignment structure remarkably reduces the cell area, but has a poor noise property.

In the folded bit line method, the active region and the bit line can be connected according to a local interconnection method, or the active regions can be formed in a T shape. However, in the open bit line method suitable for high integration, the interval of the active regions is very small (1F), and thus the adjacent active regions are shorted out when forming the T-shaped active regions or connecting the local interconnection.

Figure 3:
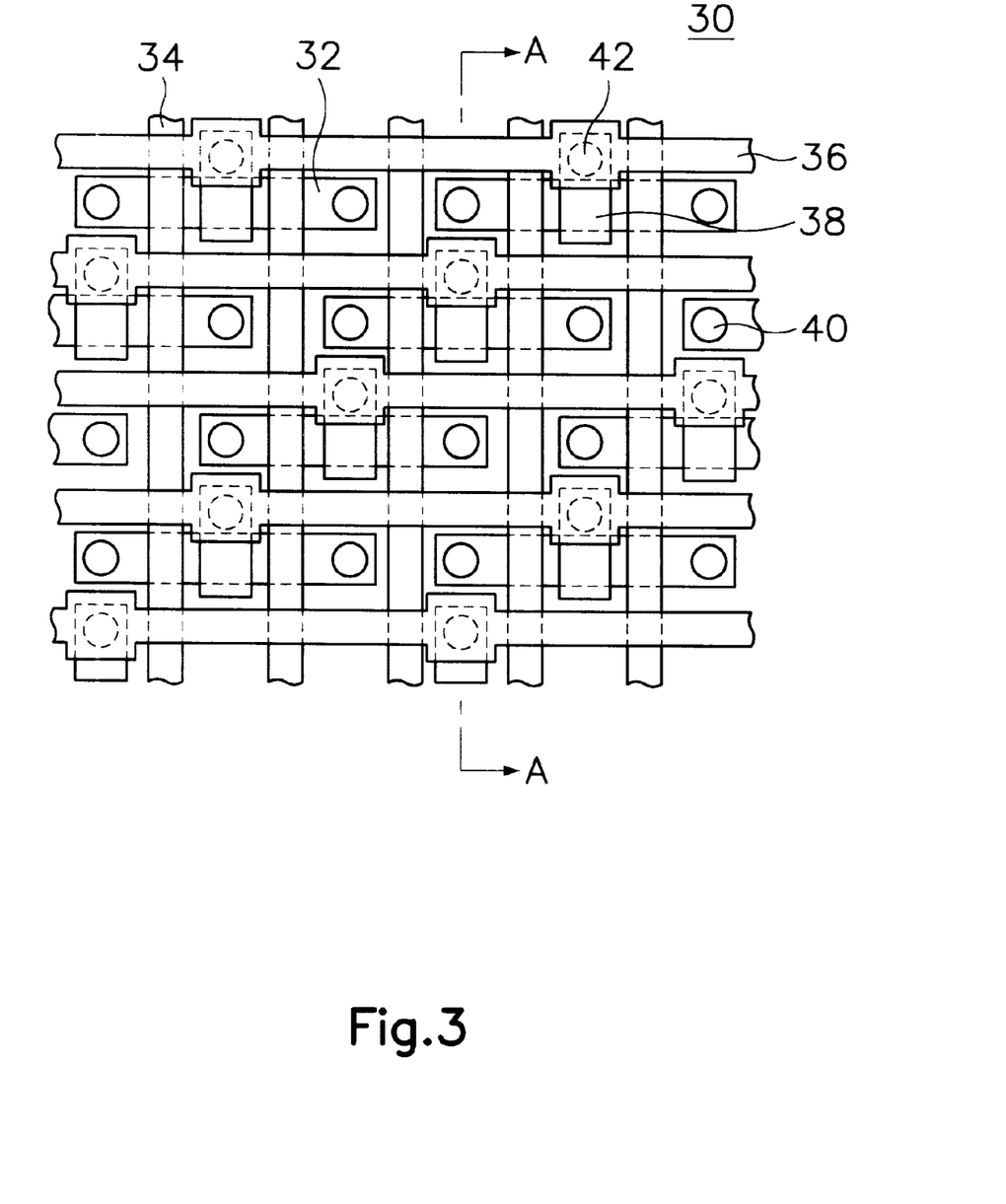
FIG. 3 is a layout diagram illustrating a third example of a conventional semiconductor device.
Figure 4:
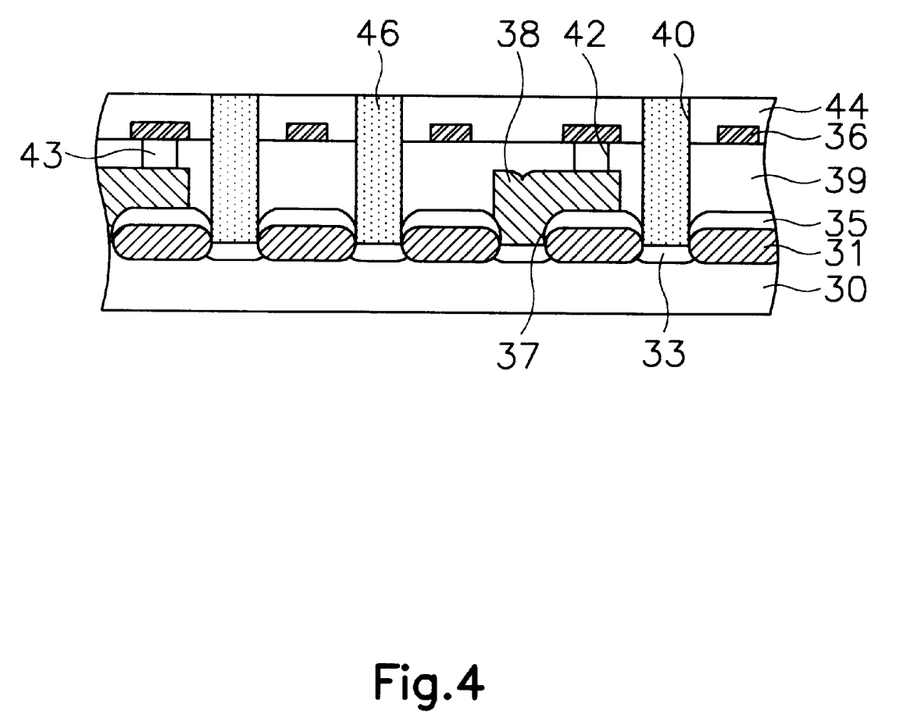
FIG. 4 is a cross-sectional diagram of a conventional semiconductor device, taken along line A—A of FIG. 3.

FIGS. 3 and 4 are diagrams illustrating a third example of the conventional semiconductor device. This open bit line cell alignment is disclosed in U.S. Pat. No. 5,877,522 and overcomes disadvantages of the structure of FIG. 2.

The third example is similar to the second example of FIG. 2. Here, bit line contact portions are enlarged more than line portions, and an interval of the lines is increased.

A field oxide film 31 is formed on a P-type semiconductor substrate 30 to define rectangular active regions 32. A pair of word lines 34 crossing the active region 32 extends in a horizontal direction. N-type diffusion regions 33 are formed at the active regions 32 at both sides of the word lines 34. A first interlayer insulating film 35 covers the resultant structure. A local interconnection contact hole 37 is formed to expose the diffusion region 33, by removing the first interlayer insulating film 35 at a predetermined portion where a bit line contact is to be formed in the diffusion region 33. A local interconnection 38 filling up the local interconnection contact hole 37 and having its one side portion extended over the first interlayer insulating film 35 is formed in a ']' shape by using a conductive layer, to obtain a bit line contact margin.

A second interlayer insulating film 39 is formed over the resultant structure. A bit line contact hole 42 is formed to expose the local interconnection 38, by removing the second interlayer insulating film 39 at a predetermined portion where a bit line contact of the local interconnection 38 is to be formed. A bit line contact plug 43 is formed to fill up the bit line contact hole 42. A bit line 36 contacting the contract plug 43 is formed on the second interlayer insulating film 39.

A third interlayer insulating film 44 is formed over the resultant structure. A charge storage electrode contact hole 40 is formed by removing a predetermined portion of layers from the third interlayer insulating film 44 to the first interlayer insulating film 35 in sequence where a charge storage electrode contact of the diffusion region 33 is to be formed, thereby exposing the diffusion region 33. A charge storage electrode contact plug 46 is formed to fill up the charge storage electrode contact hole 40.

In the conventional open bit line type local interconnection suggests 6F² cell alignment, the local interconnection and the adjacent active regions are not shorted due to a different height. However, an interval of the bit lines is also over 1F, an interval or width of the other layers is over 1F, and thus the actual cell area is over $6F_2$. The local interconnection and the charge storage electrode contact plug may generate short due to a small process margin. It is thus difficult to achieve high integration of the cell, and improve a process yield and reliability of the device.

SUMMARY OF THE INVENTION

Accordingly, a method consistent with the principles of the present invention provides for fabricating a semiconductor device which can, for example, reduce a cell area by forming a hard mask and a side wall spacer in a local interconnection and a bit line to be self aligned, and improve a process yield and reliability of the device by preventing adjacent conductive layers from being shorted out.

In accordance with another embodiment consistent with the principles of the present invention, a method for fabricating a semiconductor device in an open bit line cell structure includes the steps of: defining an active region by performing a shallow trench isolation process on a semiconductor substrate; forming a gate oxide film on the active region; forming a stacked structure of a gate electrode and a first hard mask on the gate oxide film to cross the active region; forming a first spacer at a side wall of the first hard mask and the gate electrode; forming a diffusion region on the semiconductor substrate at a side of the gate electrode; forming a first interlayer insulating film over a resultant structure; forming a landing plug poly contact hole to expose the diffusion region, by removing the first interlayer insulating film on the diffusion region; forming a landing plug poly to fill up the landing plug poly contact hole; forming a second interlayer insulating film over the resultant structure; forming a local interconnection contact hole by removing a predetermined portion of the second interlayer insulating film where a bit line contact of the landing plug poly is to be formed; forming a local interconnection and a second hard mask in sequence wherein the local interconnection contacts the landing plug poly through the local interconnection contact hole and is thicker than the second interlayer insulating film; forming a second spacer at a side wall of the local interconnection and the hard mask; forming a third interlayer insulating film over the resultant structure; forming a bit line contact hole by sequentially removing the third interlayer insulating film and the second hard mask at a predetermined portion where a bit line contact of the local interconnection is to be formed; forming a bit line and a third hard mask, wherein the bit line contacts the local interconnection through the bit line contact hole, and is thicker than the third interlayer insulating film; forming a third spacer at a side wall of the bit line and the third hard mask; forming a fourth interlayer insulating film over the resultant structure; forming a charge storage electrode contact hole, by removing a predetermined portion of layers from the fourth interlayer insulating film to the second interlayer insulating film in sequence where a charge storage electrode contact of the landing plug poly is to be formed, thereby exposing the landing plug poly; and forming a charge storage electrode contact plug to fill up the contact hole.

BRIEF DESCRIPTION OF THE DRAWINGS

The present invention will become better understood with reference to the accompanying drawings which are given only by way of illustration and thus are not restrictive of the present invention, wherein.

DETAILED DESCRIPTION OF THE PREFERRED EMBODIMENTS

A method for fabricating a semiconductor device, in accordance with an embodiment consistent with the principles of the present invention, will now be described in detail with reference to the accompanying drawings.

FIGS. 5a to 5f and 6a to 6f are cross-sectional diagrams illustrating a method for fabricating a semiconductor device, in accordance with an embodiment consistent with the principles of the present invention.

Figure 5A:
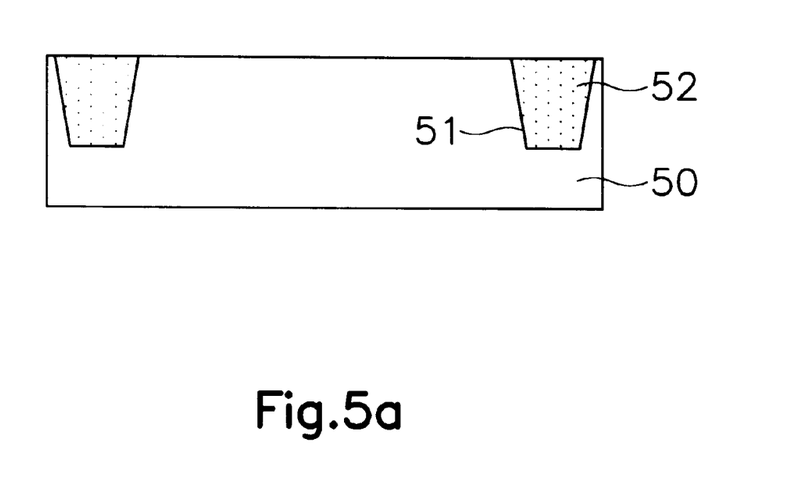
FIGS. 5a through 5f are cross-sectional diagrams illustrating a method for fabricating a semiconductor device, in accordance with an embodiment consistent with the principles of the present invention.
Figure 5B:
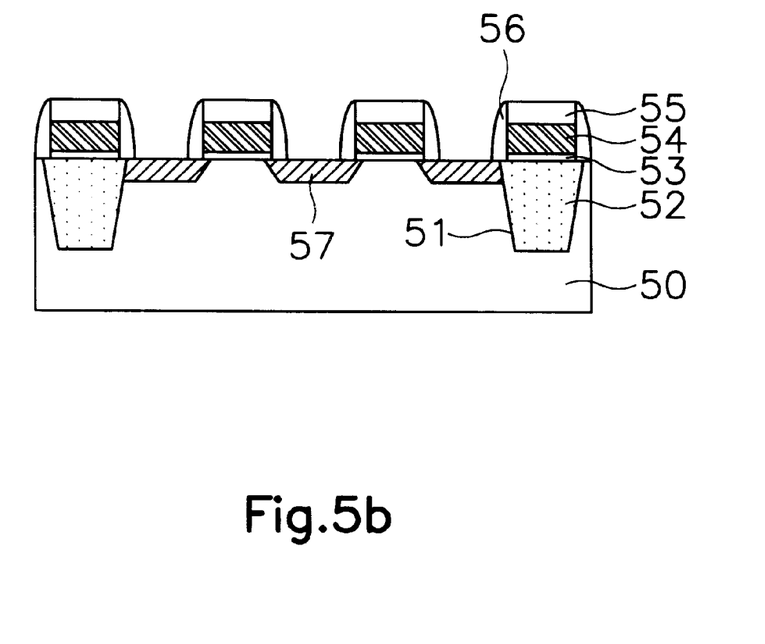
Figure 5C:
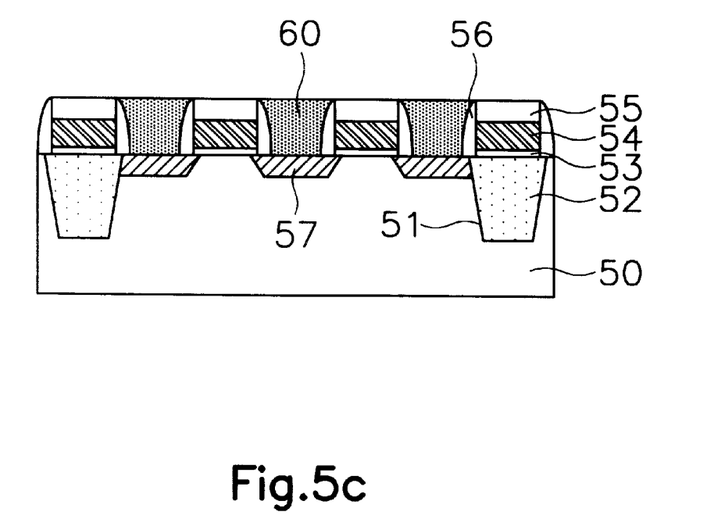
Figure 5D:
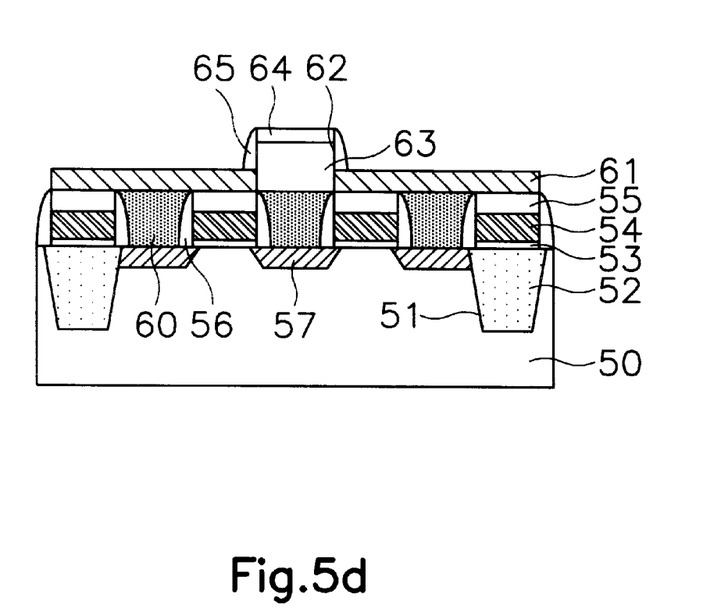
Figure 5E:
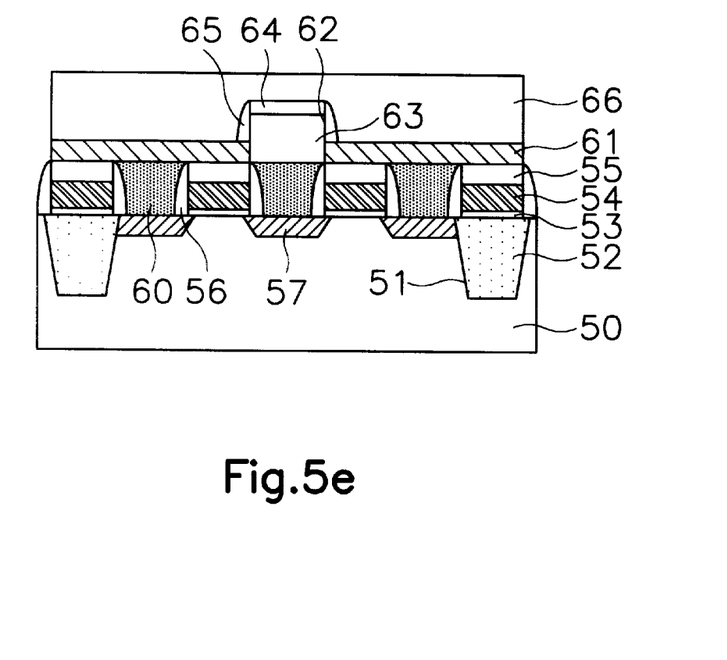
Figure 5F:
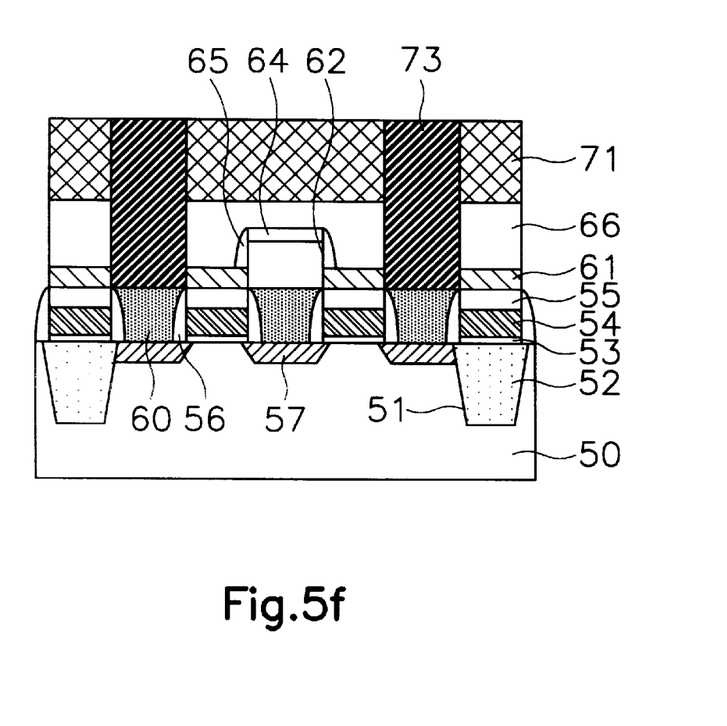
Figure 6A:
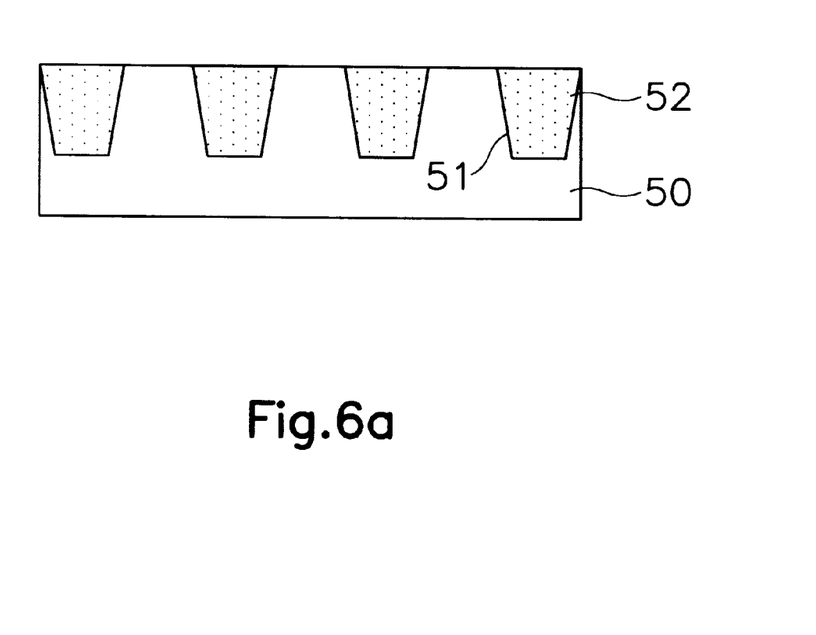
FIGS. 6a through 6f are cross-sectional diagrams illustrating a method for fabricating a semiconductor device, in accordance with an embodiment consistent with the principles of the present invention.
Figure 6B:
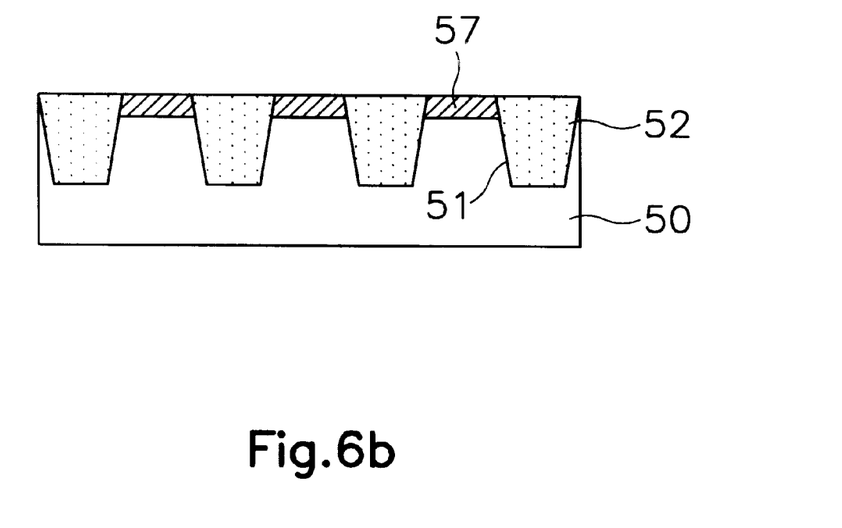
Figure 6C:
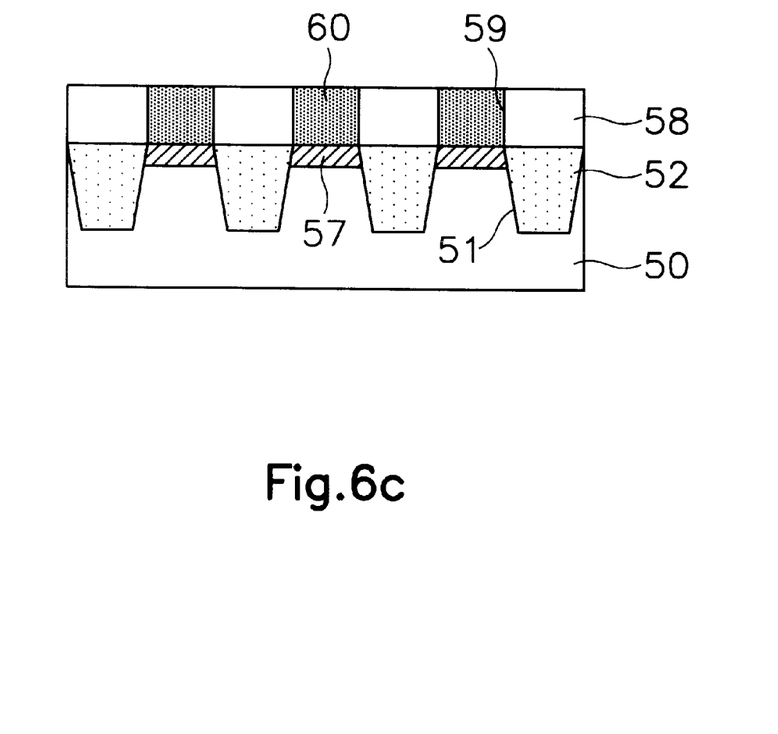
Figure 6D:
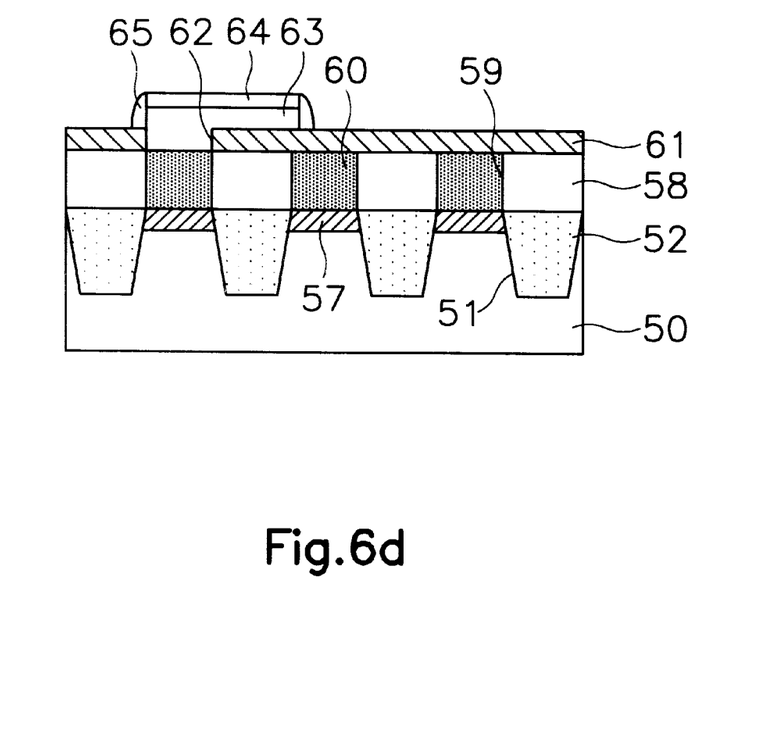
Figure 6E:
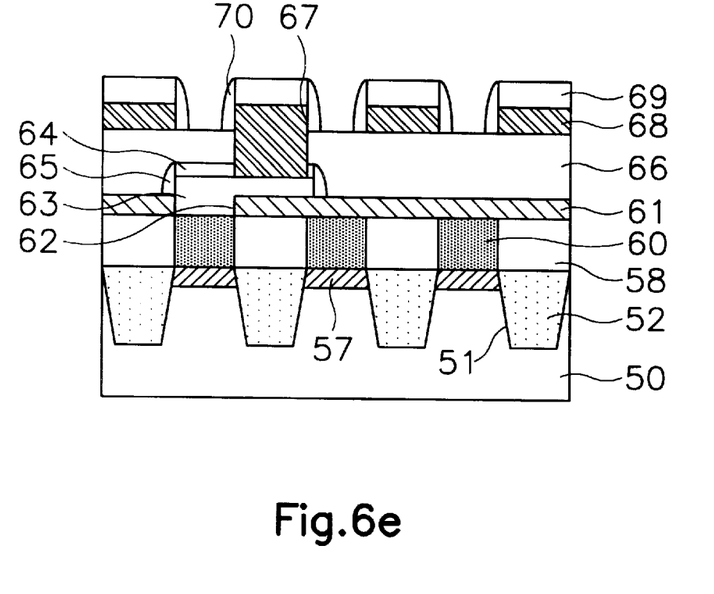
Figure 6F:
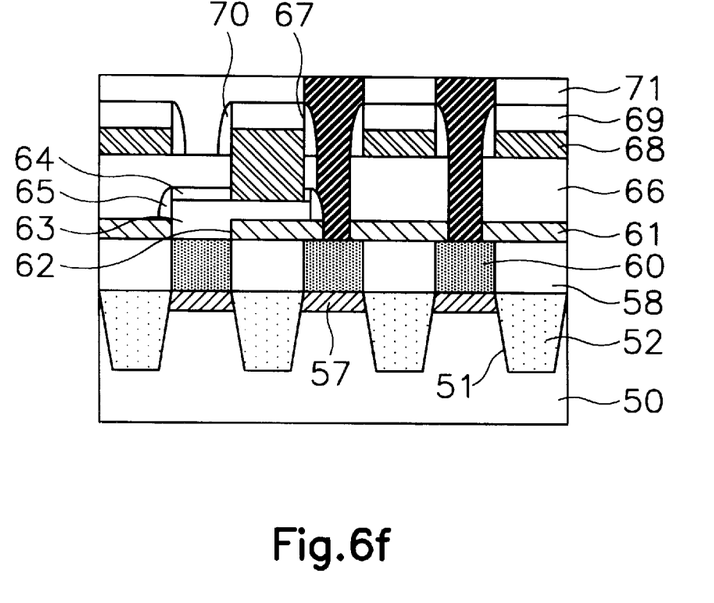

An active region is defined by forming a trench 51 on a semiconductor substrate 50 according to a shallow trench isolation process, and forming an element isolating film 52 to fill up the trench 51 (see FIGS. 5a and 6a). A gate oxide film 53, a gate electrode 54 and a first hard mask 55 are formed on the semiconductor substrate 50, a first spacer composed of an insulating film is formed at side walls thereof, and an n-type diffusion region 57 is formed on the semiconductor substrate 50 (see FIGS. 5b and 6b).

Thereafter, a first interlayer insulating film 58 is formed over the resultant structure. A landing plug poly contact hole 59 is formed to expose the diffusion region 57, by removing the first interlayer insulating film 58 on the diffusion region 57. A polysilicon layer is deposited to fill up the landing plug poly contact hole 59, and planarized according to a chemical mechanical polishing (CMP) process, thereby forming a landing plug poly 60. The landing plug poly 60 serves to reduce an etching height in formation of a charge storage electrode contact hole (see FIGS. 5c and 6c).

A second interlayer insulating film 61 is formed over the resultant structure. A local interconnection contact hole 62 is formed by removing the second interlayer insulating film 61 at a predetermined portion where a bit line contact is to be formed. A local interconnection 63 contacting the landing plug poly 60 through the contact hole 62 is formed to be thicker than the second interlayer insulating film 61 using a conductive layer pattern such as a polysilicon layer. Here, a second hard mask pattern 64 is formed thereon to overlap with the upper portion of the local interconnection 63. A second spacer 65 composed of an insulating film is formed at side walls of the local interconnection 63 and the hard mask 64 (see FIGS. 5d and 6d).

A third interlayer insulating film 66 is formed over the resultant structure. A bit line contact hole 67 is formed by sequentially removing the third interlayer insulating film 66 and the second hard mask 64 at a predetermined portion where a bit line contact of the local interconnection 63 is to be formed. A bit line 68 and a third hard mask 69 are formed. The bit line 68 contacts the local interconnection 63 through the contact hole 67 and is thicker than on the third interlayer insulating film. A third spacer 70 is formed at side walls of the bit line 68 and the third hard mask 69 (see FIGS. 5e and 6e).

A fourth interlayer insulating film 71 is formed over the resultant structure. A charge storage electrode contact hole 72 is formed by removing a predetermined portion of layers from the fourth interlayer insulating film 71 to the second interlayer insulating film 61 in sequence where a charge storage electrode contact is to be formed, thereby exposing the landing plug poly 60 diffusion region 57. A charge storage electrode contact plug 73 is formed according to a photolithography process to fill up the contact hole 72 (see FIGS. 5f and 6f).

Here, the interlayer insulating films are formed of oxide films, and the spacers and hard masks are formed of nitride films, thereby obtaining an etching selection ratio. The landing plug poly, the charge storage electrode contact plug and the local interconnection are formed of conductive layers such as a polysilicon layer or selectively deposited W.

Figure 7A:
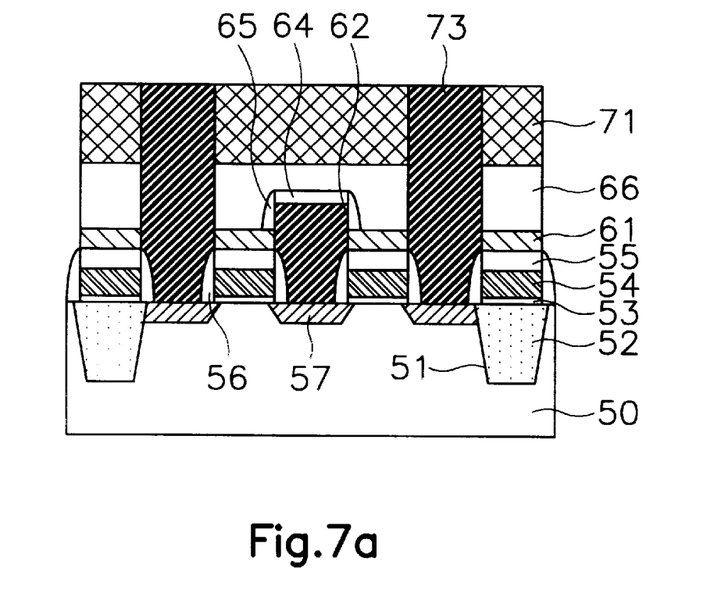
FIG. 7a is a cross-sectional diagram illustrating a semiconductor device, in accordance with an embodiment consistent with principles of the present invention.
Figure 7B:
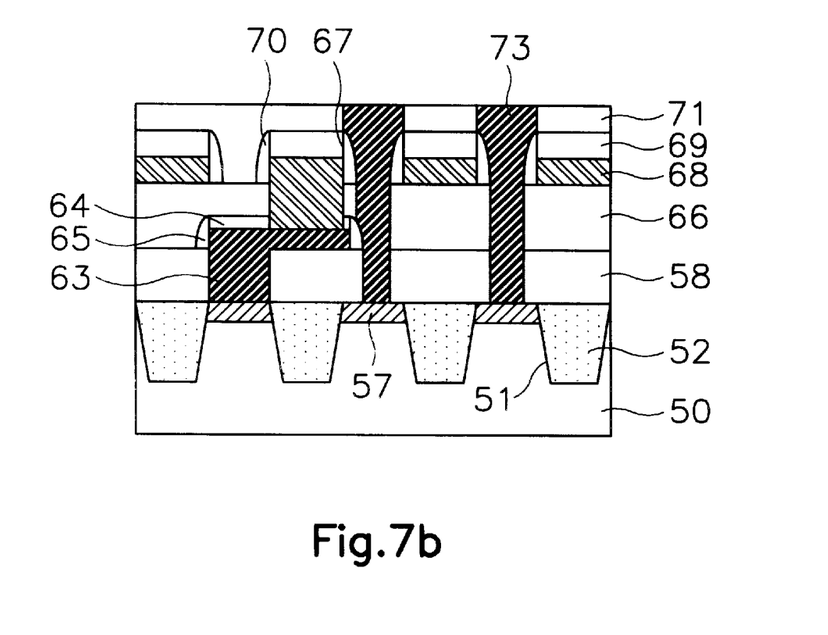
FIG. 7b is a cross-sectional diagram illustrating a semiconductor device, in accordance with an embodiment consistent with the principles of the present invention.

FIGS. 7a and 7b are cross-sectional diagrams illustrating a semiconductor device, in accordance with an embodiment consistent with the principles of the present invention. The semiconductor device has the same construction as the semiconductor device of FIGS. 5f and 6f, except that the landing plug poly 60 is not formed.

As discussed earlier, in accordance an embodiment consistent with the principles of the present invention, the hard masks are formed on the respective conductive layers and the insulating spacers are formed at the side walls thereof in the open bit line cell aligned local interconnection type device having a minimum line width of 1F and a pattern interval of 1F, thereby preventing the adjacent conductive layers from being shorted out and maintaining the minimum pattern interval. As a result, this embodiment of the present invention achieves high integration of the device, and improves the process yield and reliability of the device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for fabricating a semiconductor device, the method comprising:

defining an active region by performing a shallow trench isolation process on a semiconductor substrate;

forming a gate oxide film on the active region;

forming a stacked structure of a gate electrode and a first hard mask on the gate oxide film to cross the active region;

forming a first spacer at side walls of the first hard mask and the gate electrode;

forming a diffusion region on the semiconductor substrate at a side of the gate electrode;

forming a first interlayer insulating film over the resultant structure;

forming a landing plug poly contact hole to expose the diffusion region, by removing the first interlayer insulating film on the diffusion region;

forming a landing plug poly to fill up the landing plug poly contact hole;

forming a second interlayer insulating film over the resultant structure;

forming a local interconnection contact hole by removing a predetermined portion of the second interlayer insulating film where a bit line contact of the landing plug poly is to be formed;

forming a local interconnection and a second hard mask in sequence, wherein the local interconnection contacts the landing plug poly through the local interconnection contact hole and is thicker than the second interlayer insulating film;

forming a second spacer at a side wall of the local interconnection and the hard mask;

forming a third interlayer insulating film over the resultant structure;

forming a bit line contact hole by sequentially removing the third interlayer insulating film and the second hard mask at a predetermined portion where a bit line contact of the local interconnection is to be formed;

forming a bit line and a third hard mask wherein the bit line contacts the local interconnection through the bit line contact hole, and is thicker than the third interlayer insulating film;

forming a third spacer at a side wall of the bit line and the third hard mask;

forming a fourth interlayer insulating film over the resultant structure;

forming a charge storage electrode contact hole, by removing a predetermined portion of layers from the fourth interlayer insulating film to the second interlayer insulating film in sequence where a charge storage electrode contact of the landing plug poly is to be formed, thereby exposing the landing plug poly; and forming a charge storage electrode contact plug to fill up the contact hole.

2. The method according to claim 1, wherein the first to fourth interlayer insulating films are oxide films, and the first to third hard masks and the first to third spacers are nitride films.

* * * * *